(12) United States Patent
Bydder et al.

(10) Patent No.: US 6,593,741 B2
(45) Date of Patent: Jul. 15, 2003

(54) MAGNETIC RESONANCE IMAGING

(75) Inventors: Mark Bydder, London (GB); Joseph V. Hajnal, London (GB); David J. Larkman, London (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/126,707

(22) Filed: Apr. 19, 2002

(65) Prior Publication Data

US 2003/0025499 A1 Feb. 6, 2003

(30) Foreign Application Priority Data

Apr. 20, 2001 (GB) .............................................. 0109791

(51) Int. Cl.$^7$ ................................................ G01V 3/00
(52) U.S. Cl. ...................................... 324/307; 324/309
(58) Field of Search ................................. 324/309, 307, 324/306, 300, 312, 314, 318, 322

(56) References Cited

U.S. PATENT DOCUMENTS

| | | | |
|---|---|---|---|
| 6,396,269 B1 * | 5/2002 | Hajnal et al. | 324/307 |
| 6,448,771 B1 * | 9/2002 | Harvey et al. | 324/307 |
| 6,487,436 B1 * | 11/2002 | Boskamp et al. | 600/422 |

FOREIGN PATENT DOCUMENTS

| | | |
|---|---|---|
| EP | 1 014 102 | 6/2000 |
| WO | WO 98/21600 | 5/1998 |
| WO | WO 99/54746 | 10/1999 |
| WO | WO 00/72034 | 11/2000 |
| WO | WO 00/72050 A1 | 11/2000 |

OTHER PUBLICATIONS

Anonymous; MR–Imaging; Research Disclosure, Kenneth Mason Publications, Hampshire, GB, No. 429, Jan. 2000, p. 66.

Dr. Mark Bydder, et al.; "Use of Information Theory to align separately acquired reference and target data for SENSE processing"; Proc. of Intl. Soc. Mag. Reson. Med., 9th Meeting, vol. 1, Apr. 2001, p. 773.

David Atkinson, et al., "Automatic Correction of Motion Artifacts in Magnetic Resonance Images Using an Entropy Focus Criterion"; IEEE Transactions on Medical Imaging, vol. 16, No. 6, Dec. 1997.

Peter M. Jakob, et al., "AUTO–SMASH: A self–calibrating technique for SMASH imaging"; Magnetic Resonance Materials in Physics, Biology and Medicine, vol. 7, No. 1, Nov. 1998, pp. 42–54.

Klaas P. Pruessmann, et al.; "SENSE: Sensitivity Encoding for Fast MRI"; Magnetic Resonance in Medicine, vol. 42, No. 5, Nov. 1999, pp. 952–962.

PCT International Search Report for International application no. PCT/US02/12523.

Search Report under Section 17(5) for Application GB 0109791.4 dated Nov. 15, 2001.

* cited by examiner

Primary Examiner—Louis Arana
(74) Attorney, Agent, or Firm—Thomas M. Lundin

(57) ABSTRACT

Magnetic resonance imaging apparatus uses an array of at least two receive coils 4, 5 to perform parallel processing to enable phase-encode gradients to be omitted during data collection, and restored during processing using parallel processing to further reduce patient time in the apparatus, pre-acquired reference data is used (modules 10, 11) to unfold the aliased target data in modules 8, 9. In accordance with the invention, the unfolding is performed against a series of representations of the reference data, varied for translational rotational and coil loading errors, and the unfolded image is chosen as that having the minimum entropy.

10 Claims, 8 Drawing Sheets

MAGNETIC RESONANCE IMAGING

BACKGROUND

This invention relates to magnetic resonance (MR) imaging.

The invention is particularly concerned with reduction in the time needed to collect data for imaging a region of interest of a patient.

A prior art magnetic resonance imaging apparatus is shown in FIG. 1. A patient 1 (shown in section) is slid axially into the bore 2 of a superconducting magnet 3, and the main magnetic field is set up along the axis of the bore, termed by convention the Z-direction. Magnetic field gradients are set up, for example, in the Z-direction, to confine the excitation of magnetic resonant (MR) active nuclei (typically hydrogen protons in water and fat tissue) to a particular slice in the Z-direction e.g. that illustrated in FIG. 1 and, in the horizontal X and the vertical Y-directions as seen in FIG. 1, to encode the resonant MR nuclei in the plane of the slice. An r.f. transmit coil (not shown) applies an excitation pulse to excite the protons to resonance, and an r.f. receive coil arrangement comprising an array of receive coils 4, 5 picks up relaxation signals emitted by the disturbed protons.

To encode/decode received signals in the Y-direction, the signals are detected in the presence of a magnetic field gradient, termed a frequency encode or read-out (R.O.) gradient, to enable different positions of relaxing nuclei to correspond to different precession frequencies of those nuclei about the direction of the main magnetic field due to the influence of the gradient. The data is digitised, and so for each r.f. excitation pulse, a series of digital data points are collected, and these are mapped into a spatial frequency domain known as k-space (FIG. 2). Each r.f. pulse permits at least one column of digital data points to be collected.

To encode/decode the received signals in the X-direction, after each r.f. pulse has been transmitted and before data is collected with the read-out gradient applied, a magnetic field gradient in the X-direction is turned on and off. This is done for a series of magnitudes of magnetic field gradients in the X-direction, one r.f. pulse typically corresponding to a different magnitude of gradient in the X-direction.

On the k-space matrix shown in FIG. 2, the columns of data points correspond to data collected at different magnitudes of phase-encode (P.E.) gradients.

The field of view imaged by the magnetic resonance imaging apparatus depends on the spacing of the data points in the phase-encode and read-out directions, and the resolution of the image depends on how far the points extend in each direction i.e. how large the maximum phase-encode gradient is, and on the magnitude of the read-out gradient combined with the duration of data collection.

Conventionally, the data collected by the r.f. receive coil arrangement and depicted in FIG. 2 is subject to a two dimensional fast Fourier Transform in a Fourier Transform processor (not shown) to produce a pixelated spatial image.

A slice image is shown in FIG. 3. For the purposes of explanation, the symbol of a circle 1a, has been illustrated in both the patient 1 shown in FIG. 1 and the image shown in FIG. 3. FIG. 3 implies that the spacing of data points in the phase-encode gradient direction is sufficient to image the whole of the circle shown in FIG. 1.

Between each r.f. pulse, there is a certain minimum pulse repetition time, and the collection of data implied by FIGS. 2 and 3 may therefore take an undesirably long time.

One technique used to reduce the data collection time is to cut out, say, half the phase-encode steps e.g. by keeping the same maximum phase-encode gradient but omitting every other column of data. This would then halve the data collection time.

The spacing of the datapoints in the phase-encode direction would now have doubled, so that the field of view in the corresponding image domain would have halved. (The field of view in the read-out direction would remain the same because the number of data points collected during read-out would remain the same.) The imaged area would now cover little more than half the width of the circle illustrated in FIG. 1. This is shown by the area 1b in FIG. 5. Unfortunately, aliasing causes the regions at the side of the circle to be folded back into the half-width area, the left hand region in FIG. 5 corresponding to the right hand region of the image, and vice versa.

To enable the data to be unfolded, the data is acquired using parallel imaging.

Parallel imaging makes use of spatial sensitivity differences between individual coils in an array to reduce the gradient encoding required during image acquisition. This reduces acquisition times by decreasing the number of phase-encoded lines of k-space that must be acquired. One practical implementation of parallel imaging, is known as SENSE (Magnetic Resonance in Medicine 42: 952–962 (1999)—SENSE: Sensitivity Encoding for Fast MRI by Klaas P Pruessmann, Markus Weiger, Markus B Scheidegger and Peter Boesiger).

SENSE operates in the image domain for both the target image data and the coil reference data. A typical receive coil arrangement comprises coils 4 and 5 placed on opposite sides of the patient arranged as in FIG. 1, in order that they have different fields of view. The target data is acquired for each receive coil with a reduced field of view, which results in aliasing, so that each coil produces a k-space representation as shown in FIG. 4, which can be Fourier Transformed into an aliased image as shown in FIG. 5. The two aliased images of FIG. 5 are then unfolded to the full field of view on a pixel by pixel basis using reference data, which records the relative responses (sensitivity profiles) of the receive coils 4 and 5. Reduced field of view imaging imposes a requirement of uniformly spaced samples in the phase-encode direction in k-space. The processing concerned with unfolding is done in the image domain.

It is common practice to acquire the reference data with the subject in the magnetic resonance imaging apparatus. For example, the paper referred to mentions using a body coil as a third receive coil, so that the sensitivity profiles of the coils used to unfold the aliased image, can be derived. This is done by comparing the response of each coil whose sensitivity profile is to be determined with that of the body coil, for magnetic resonance signals received from the body of the patient.

Naturally, this increases the time the patient is in the magnetic resonance imaging apparatus.

Separately acquired reference data has been used to avoid this increased period in the imaging apparatus. For example, a phantom such as a volume of water has been inserted into the imaging machine before the patient is inserted, and the response of the receive coils has been measured, by comparing their outputs with that of a body coil over the volume of water. Alternatively, the response of the receive coils has been calculated theoretically.

In either case, the time the patient spends in the imaging apparatus is reduced, and the patient's exposure to r.f.

excitation radiation is reduced. The disadvantage is that the accuracy of the unfolded image depends critically on correct registration being achieved between the data collected when the patient is within the imaging apparatus, and the previously acquired reference data.

SUMMARY

The invention provides apparatus for magnetic resonance imaging, comprising means for exciting magnetic resonant (MR) active nuclei in a region of interest, an array of at least two r.f. receive coils for receiving r.f. signals from the region of interest, means for creating magnetic field gradients in a phase-encode direction for spatially encoding the excited MR active nuclei, the number of phase-encode gradients corresponding to a reduced field of view compared to the region of interest, means for unfolding a representation of the data received by the coil to the array to restore the full field of view using representations of the sensitivity profiles of the individual coils of the array, and means for comparing a plurality of unfolded representations of the data for various modifications to the sensitivity profile representations used, and for selecting an unfolded representation according to a predetermined criterion.

By applying the modifications and comparing the unfolded representations, correct registration can be achieved and the problem associated with pre-acquired reference data solved.

The sensitivity profile representations may be subject to a series of rotational or translational displacements relative to the representation of the data received, or may be modified to simulate different coil loadings. If desired, the sensitivity data for individual coils may be adjusted.

The comparison may be done in the spatial domain but could be carried out in the k-space domain if desired.

The predetermined criterion may be a singularity (singularity extremum) in a function of the intensity probability over a given range of intensities of the unfolded representations in the spatial domain, for example, a maximum of given magnitude in the intensity probability distribution, or a minimum in the summation of the magnitudes of the products of the intensity probability and the log of the intensity probability, over a predetermined range of the intensities. The latter term (the summation) is sometimes referred to as the entropy of the image.

DRAWINGS

Magnetic resonance imaging apparatus, and a method of magnetic resonance imaging, in accordance with the invention will now be described in detail, by way of example, with reference to the accompanying drawings, in which.

DESCRIPTION

Figure 1:
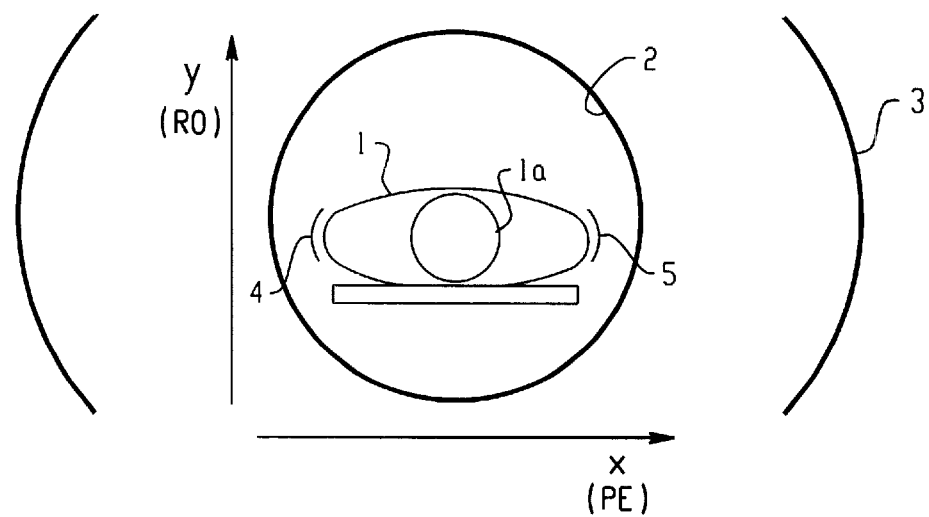
FIG. 1 is a schematic end view partly cut away, of known magnetic resonance imaging apparatus.
Figure 6:
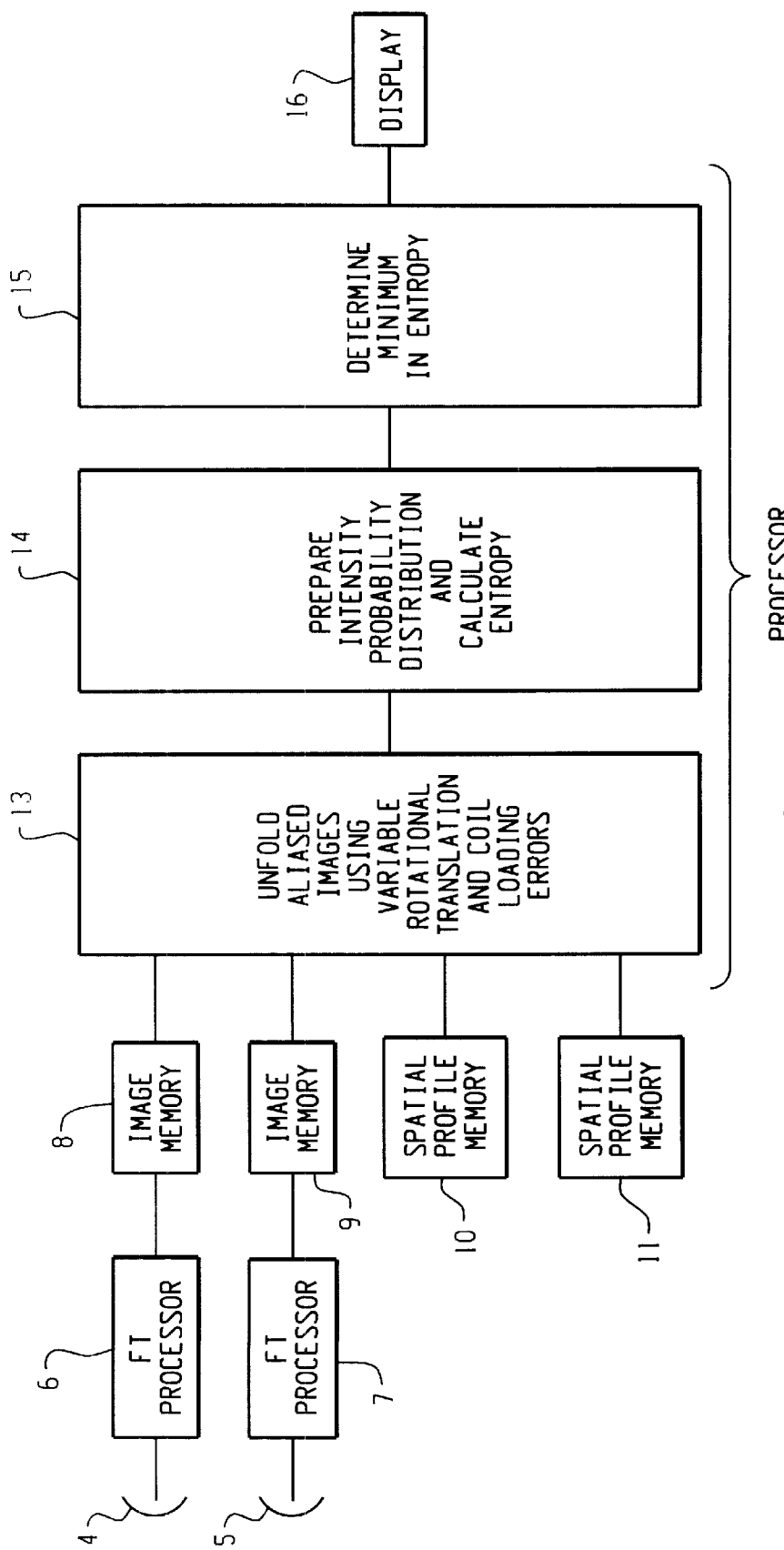
FIG. 6 represents an architecture of processing means for magnetic resonance imaging apparatus according to the invention.

Referring to FIG. 6, the processing system of the invention uses the known magnet and array coils of FIG. 1. Thus, the magnetic resonance imaging apparatus comprises a solenoidal magnet 3 which produces a main field in the Z-direction, perpendicular to the plane of the Figure. The magnet is a resistive or superconducting electromagnet, but the invention is also applicable to open magnets, permanent or otherwise. The patient 1 is slid into the bore of the electromagnet, and there is a region of uniform field containing the circle 1a.

An r.f. transmit coil (not shown) excites magnetic resonant active nuclei such as protons in the region of uniform field and, since a magnetic field gradient is created in the Z-direction by means not shown, excitation is confined to a slice normal to that direction. Means for creating magnetic field gradients (not shown) in the X and Y-directions spatially encode the excited nuclei in the usual way, the X-direction denoting phase-encode gradients and the Y-direction denoting read-out or frequency encode gradients.

Figure 2:
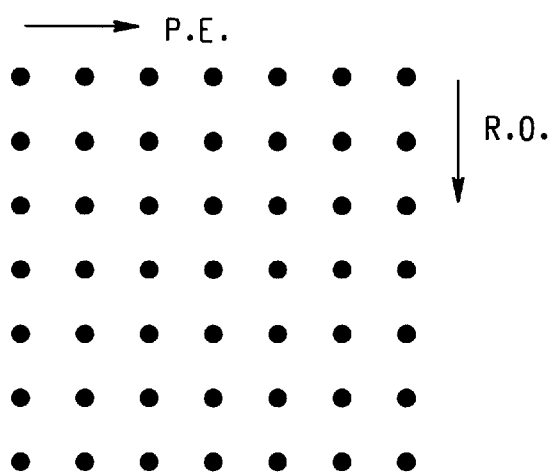
FIG. 2 is a schematic representation of a k-space matrix with the spacing of phase-encode gradients corresponding to the full field of view.
Figure 3:
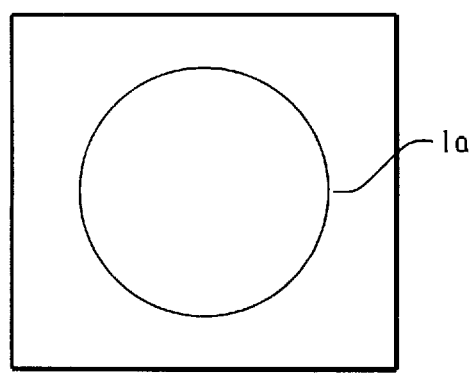
FIG. 3 is a representation of a spatial image corresponding to the k-space matrix of FIG. 2.

The receive coil arrangement is a pair of receive coils 4, 5. The processing utilises the SENSE method of parallel imaging. To produce an unfolded version of the object 1a would require the phase-encode gradients shown in FIG. 2. To reduce data collection time, alternate phase-encode gradients are omitted. The same maximum phase-encode gradient is used.

Thus, an r.f. excitation pulse is produced, and a magnetic field gradient of a particular value is turned on and then off, and the data is collected with a read-out magnetic field gradient in an orthogonal direction, resulting in the collection of a column of data. Another r.f. excitation pulse is produced, and a magnetic field gradient of a different value is turned on and then off, resulting in a second column of data collected during the read-out gradient of the same magnitude.

Figure 4:
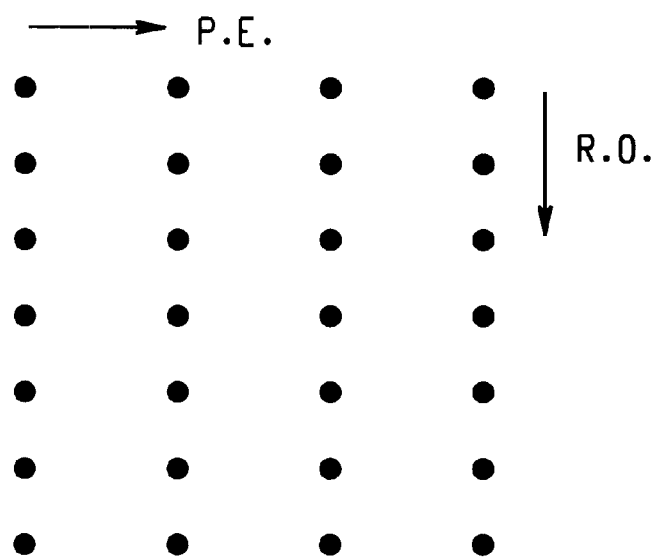
FIG. 4 is a schematic representation of a k-space matrix with the spacing of the phase-encode gradients corresponding to a reduced field of view.
Figure 5:
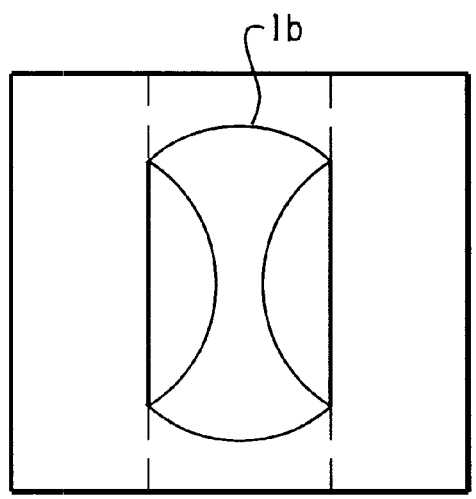
FIG. 5 is a representation of an aliased spatial image corresponding to the k-space matrix of FIG. 4.

The columns of data produced from each coil 4, 5 are Fourier Transformed in processors 6, 7 to produce spatial images. Since the field of view corresponding to the increased k-line spacing of FIG. 4 is reduced, an aliased image 1b as shown in FIG. 5 is produced as the output of each of the coils 4, 5. The aliased images are stored in image memories 8, 9.

In conventional SENSE processing, a knowledge of the spatial profiles of the coils 4, 5 is used to produce an unfolded image. Thus, the amplitude response of coil 4 is measured separately for example by comparing the output produced by the coil for each pixel of each slice of the patient, such as that containing circle 1a, with the output produced by a body coil surrounding the patient. It would be expected that the coil 4 would have a greater amplitude response to regions of the circle 1a nearer to it than regions that are further from it. The body coil, on the other hand, would have more or less the same amplitude response over the whole area of the circle. The coil 5 would have a greater response to regions of the circle nearer to it than regions further from it.

Two such folded spatial images as are shown in FIG. 5 are obtained by using the pair of coils. Each pixel in the overlapped region of each folded image has an intensity which depends on the two regions in space which map to that pixel, but the two receive coils have different relative sensitivities for the two regions. As explained in our co-pending European patent application no. 00310109.4, this provides sufficient information for the two folded images to be replaced by one unfolded image.

Figure 7:
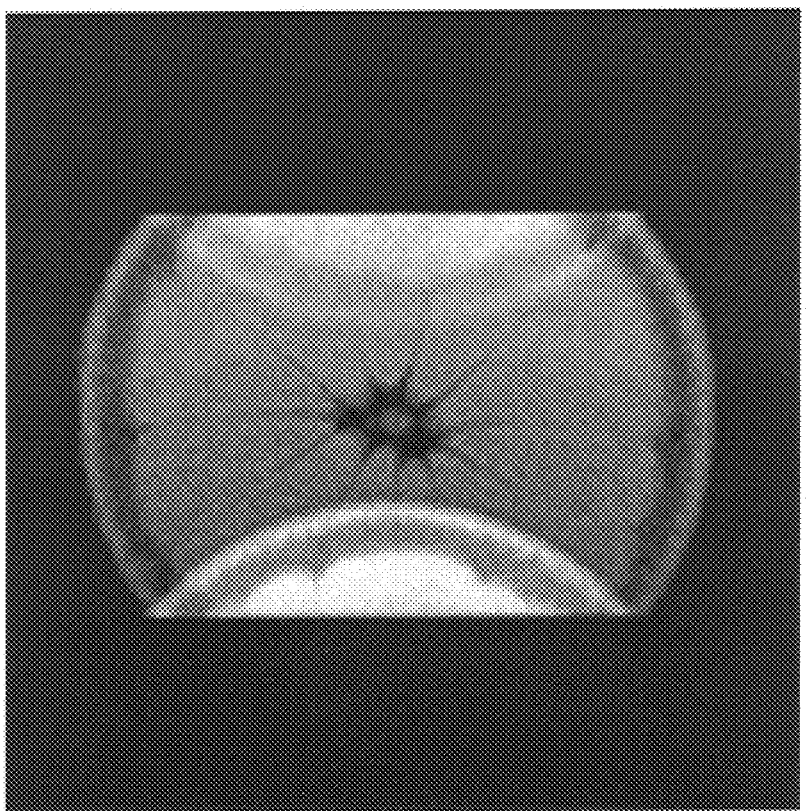
FIG. 7 is an aliased image derived from one of a pair of receive array coils.
Figure 8:
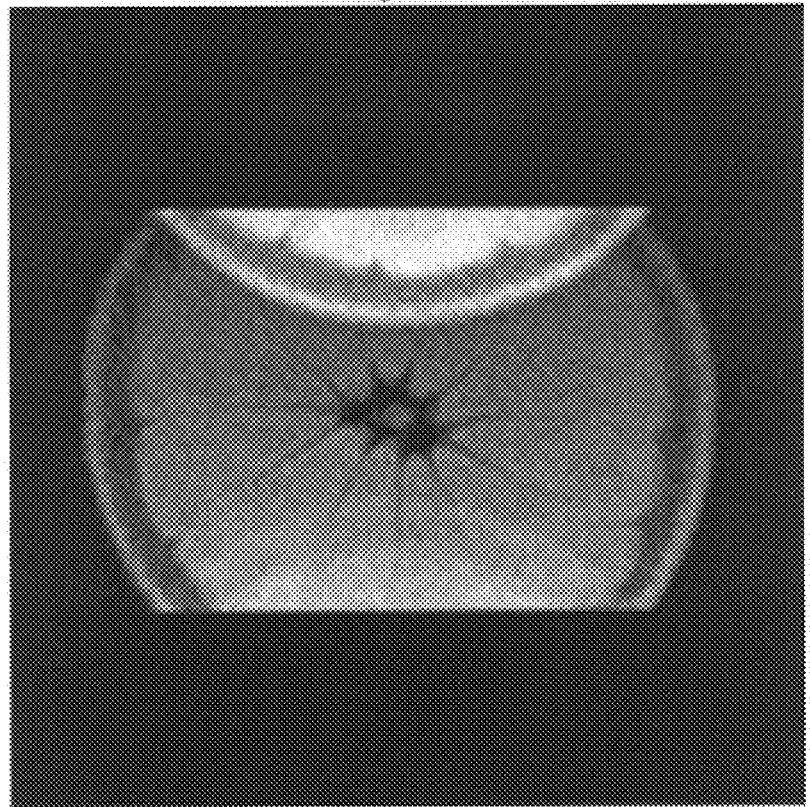
FIG. 8 is an aliased image derived from the other of a pair of receive array coil.

FIGS. 7 and 8 are examples of the folded images (of a slice of an orange arranged in the position of the circle 1a in FIG. 1). With the arrangement of FIG. 1, the images of FIGS. 7 and 8 will appear with the vertical edges upright, as in FIG. 5.

The apparatus includes memories 10, 11 which contain the amplitude and phase responses (spatial profiles) of the coils 4, 5 respectively, for each pixel of each slice over the sensitive volume over which imaging takes place. This information is acquired by imaging a phantom in the sensitive volume using coils 4 and 5, but it could be acquired by direct calculation from the coil structure instead.

Figure 11:
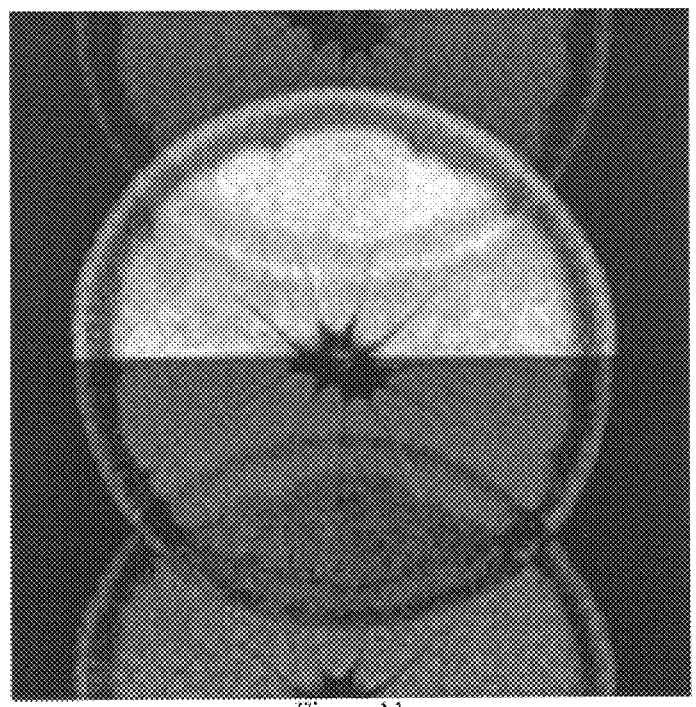
FIG. 11 is an unfolded image produced using the aliased images of FIGS. 7 and 8 but with a translational error between the aliased images and the reference spatial profiles of the pair of receive coils.

In conventional SENSE processing, a processor would use the information from the image memories and spatial profile memories, and produce an unfolded image. However, conventional SENSE processing would also dictate that the reference information was taken from a patient in situ, to provide accurate registration of data from the subject and reference data. If pre-acquired reference data were to be used, misregistration would be likely to occur, causing artefacts of the kind shown in FIGS. 9 and 11.

The apparatus of the invention includes a processor 12 for automatically obtaining registration between the data from the subject (the target data) and the pre-acquired reference data.

Thus, the processor 12 includes module 13 which unfolds the images from memories 8, 9 using the reference data from memories 10, 11. However, this is done for a whole series of modified reference data. The reference data is translated over a series of displacements, and an unfolded image is produced for each displacement. The reference data is rotated over a series of angular displacements, and an unfolded image is produced of each rotational displacement. The reference data is also adjusted for a series of different coil loading effects, which may if desired be different for each coil of the array.

Figure 10:
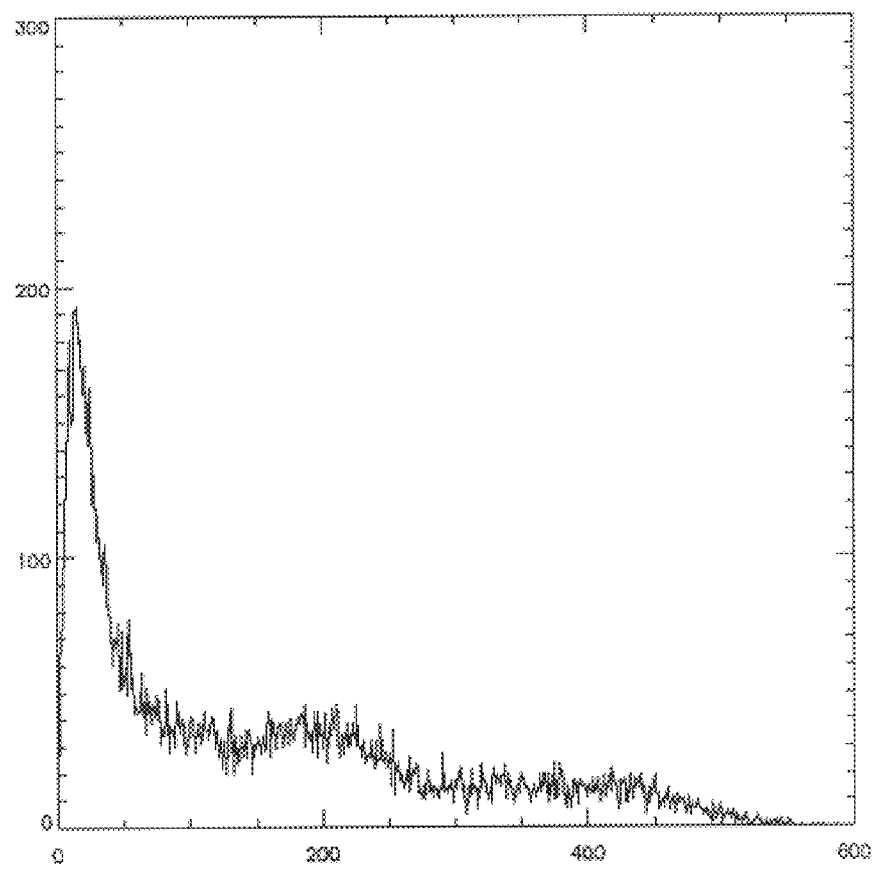
FIG. 10 is an intensity probability histogram for the image of FIG. 9.
Figure 12:
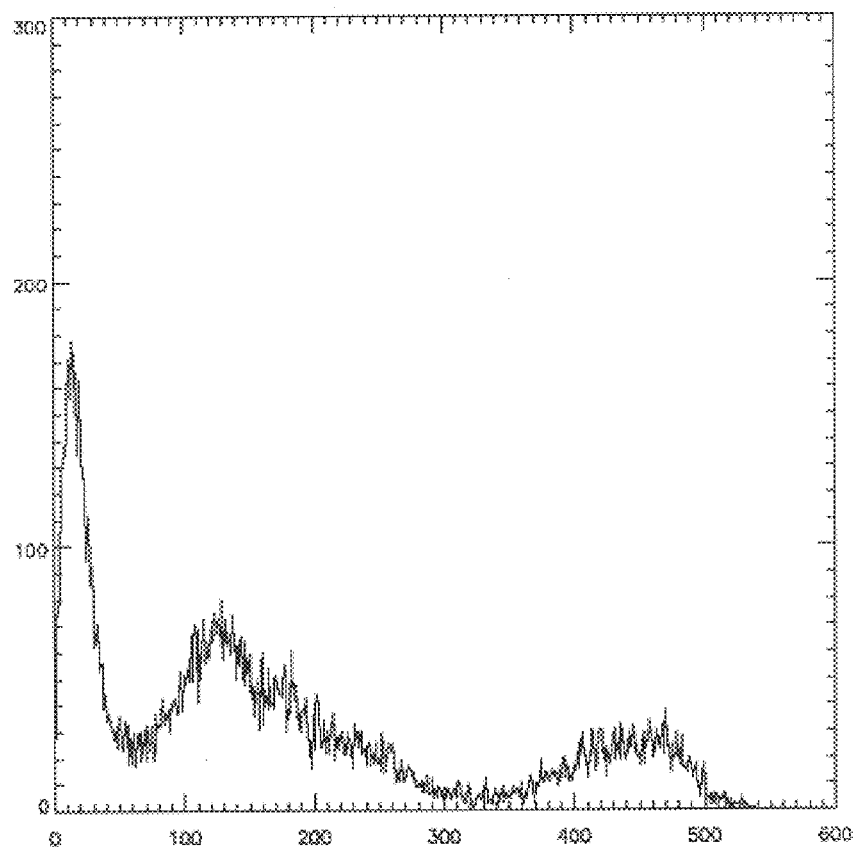
FIG. 12 is an intensity probability histogram for the image of FIG. 11.
Figure 14:
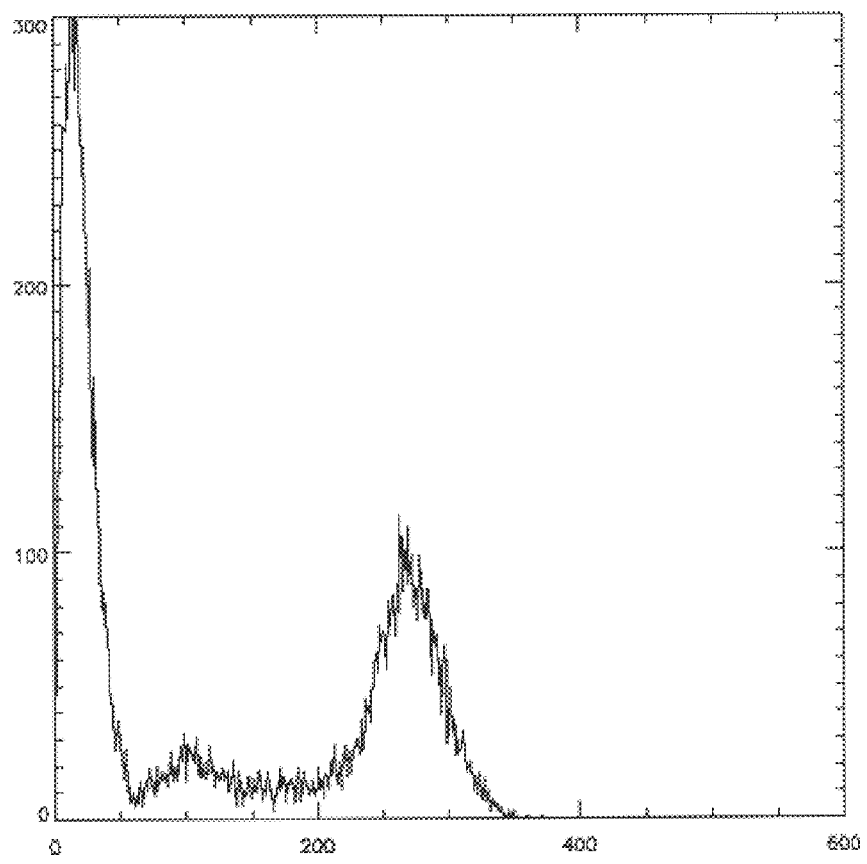
FIG. 14 is an intensity probability histogram for the image of FIG. 13.

Processing module 14 produces a histogram for each such unfolded image, such as are illustrated in FIGS. 10, 12 and 14. The horizontal axis represents particular values of the intensity of the pixels of the image, and the vertical axis represents the number of times that value is encountered over the unfolded image. When the vertical axis is normalised by the number of pixels, this provides an estimate of the probability of pixel intensity values.

Figure 13:
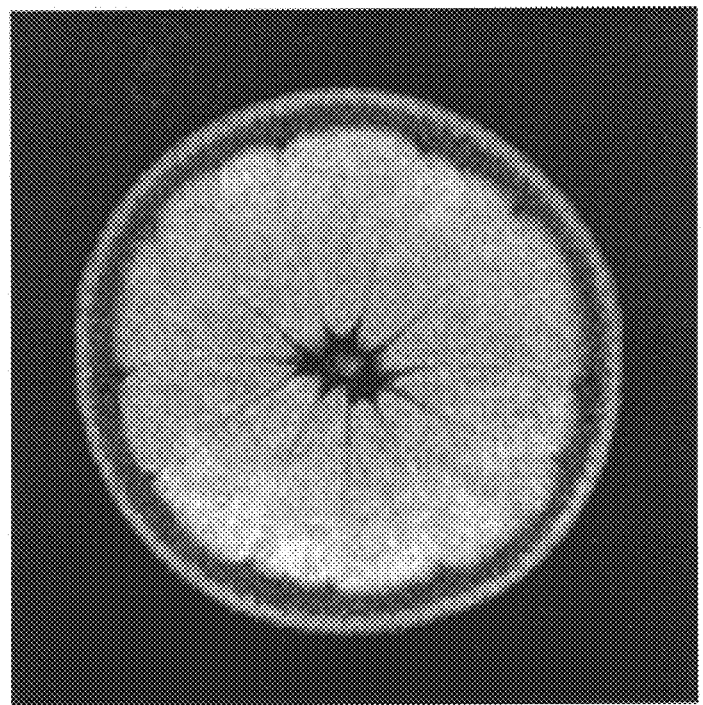
FIG. 13 is the final unfolded image corresponding to minimum entropy.
Figure 15:
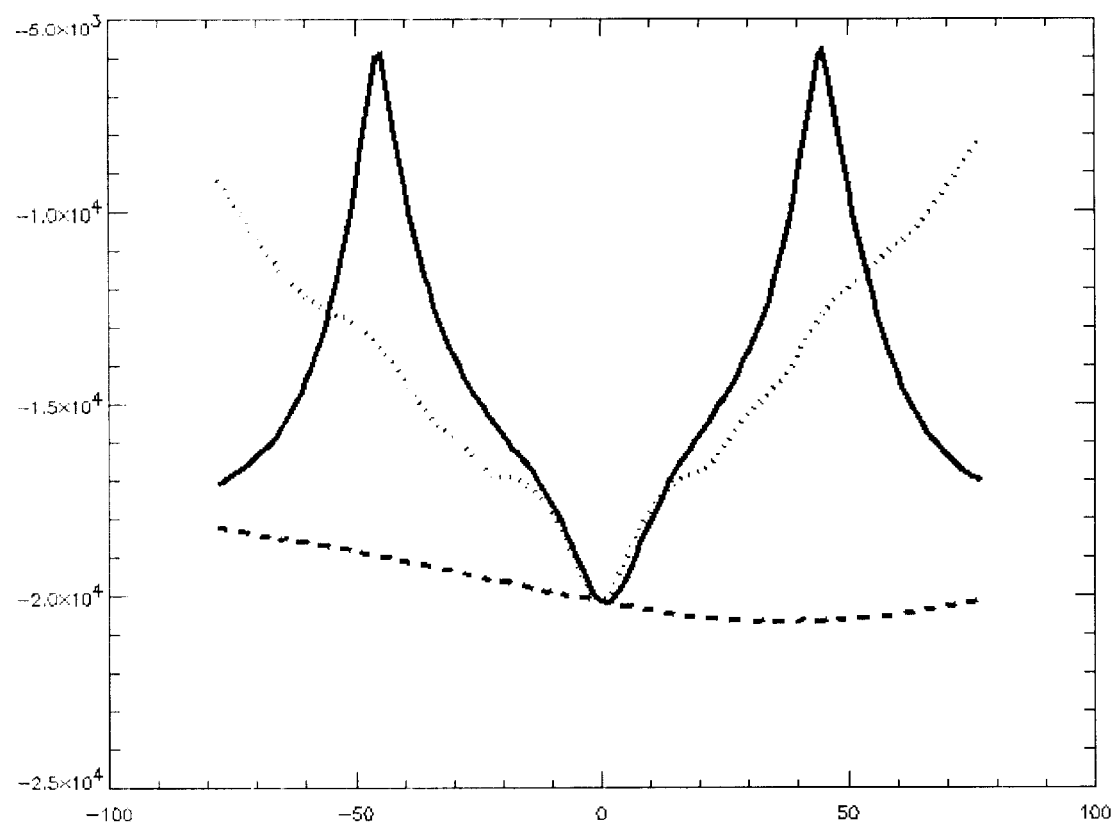
FIG. 15 is a graph showing the variation of the entropy of the unfolded image with error in the registration between the aliased images and the spatial profiles of the pair of receive coils.

The graphs thus represent the probability Pi of intensity i occurring in the image, i.e. an intensity probability distribution. From the histogram, or intensity probability distribution of each unfolded image, the module 14 calculates a value for the entropy of each image E, where Processing module 15 calculates the minimum in this entropy over all the unfolded images. It $$E = -\Sigma Pi \log Pi$$

is found, referring to FIG. 15, that the entropy passes through a minimum corresponding to an unfolded image without artefacts FIG. 13. The dotted line represents displacement in the phase-encode direction, the dashed line represents displacement in the frequency encode direction, and the solid line represents angular displacement (rotation error). The correct position is denoted by 0.

Figure 9:
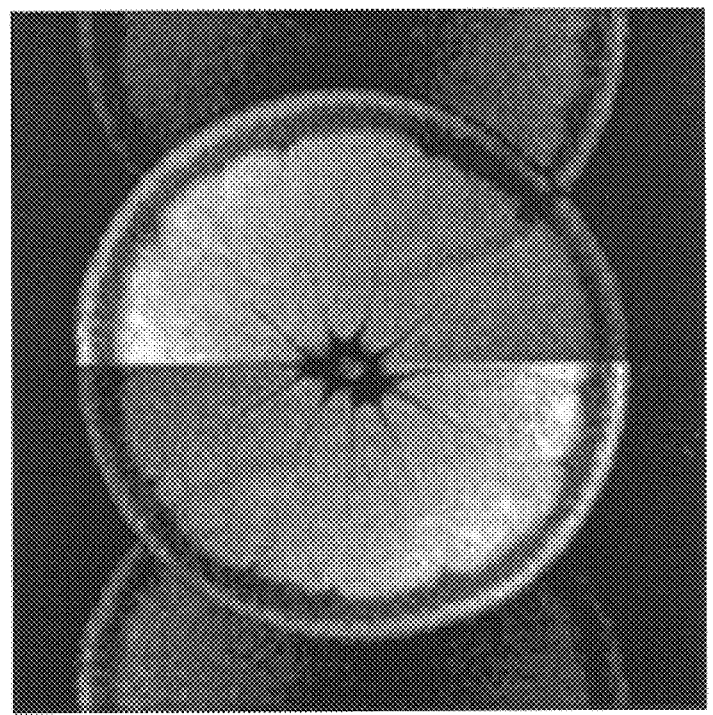
FIG. 9 is an unfolded image produced using the aliased images of FIGS. 7 and 8 but with a rotational error in the registration between the aliased images and the reference spatial profiles of the pair of receive coils.

Referring to the histograms shown in FIGS. 10, 12 and 14, FIG. 10 represents a histogram and FIG. 9 an unfolded image in which there is a rotational error in registration. The main peak represents the frequency of occurrence of intensities corresponding to the background. FIG. 12 represents a histogram and FIG. 11 an unfolded image in which there is a translational error in registration. The main peak showing background appears as before, but there are secondary peaks produced by the image. FIG. 13 represents an unfolded image and FIG. 14 a histogram in which there is correct registration. A clear peak corresponding to the image is now visible on the histogram.

It can thus be summarised that correct registration results in similar tissues having similar intensities, thus reducing the diversity of the pixel intensities in the image, and minimising its entropy, also producing more clearly defined peaks in the histogram. Incorrect registration, on the other hand, results in similar tissues having dissimilar intensities, thus increasing the uncertainty of the pixel intensities in the image, and moving the entropy away from the minimum, as well as reducing the peak height and increasing their widths in the histogram corresponding to the image.

The unfolded image corresponding to correct registration is displayed on display 16.

For low field applications, where coil loading effects are small, it may be sufficient to rotate and shift the reference data without regard for the coil loading effects.

As an alternative to correlating correct registration with minimum entropy of the unfolded image, it would be possible to search for a peak in the intensity probability distribution or histogram corresponding to predetermined criteria e.g. a peak within a predetermined intensity band of a predetermined size, or to search for a peak of defined width, or to look for the maximum or minimum of some other linear or non-linear function of the intensity histogram.

While the description above has been in regard to pre-acquired reference data, the invention is of course applicable to an imaging situation where reference data is acquired with the patient in-situ but in which the patient is moved e.g. for contrast administration. With the invention, it would not be necessary to re-acquire the reference data.

An example of the use of such apparatus will now be described.

For initial tests single slice sensitivity and reduced field of view data were acquired from phantoms and normal volunteers using four channel phased array coils on a 0.5T Apollo scanner (Marconi Medical Systems, Cleveland, Ohio). The target data was unfolded using the correctly aligned reference data and also with the reference data offset in plane by translation and rotation. In addition target data was unfolded with separately acquired reference data which had a much larger field of view. In this latter case, the sensitivity data was acquired with a 20 cm square field of view, resolution 128 by 128 TE/TR 15/400 this was fully contained within a 30 cm cylindrical saline and copper sulphate doped phantom anti aliasing was used to exclude aliasing in this data. The half field of view target data was acquired with a 9 cm square field of view, resolution 128 by 128 TE/TR 32/1000 and an orange as the target object. The target data in all cases was contained within the bounds of the reference data.

The image entropy (E) was calculated for the unfolded images as a function of reference data position and a simplex method used to find the position (two translations) and orientation (one rotation angle) for the reference data that minimised E.

Calculation of E as a function of displacement of the reference data confirmed that the entropy was a minimum at correct alignment. Minimisation of entropy provided a robust means of co-localising reference and target scans in both phantom and human data. In the data sets studied, E had a single global minimum for translation in the phase-encode direction of the target scan, a much weaker single global minimum for translation in the frequency encode direction, reflecting coil geometry. Rotations tended to produce two minima separated by about 180 degrees, reflecting the symmetry of the coil arrays used. The capture range for translation thus encompassed the full field of view sampled for the reference data, and for rotations this was reduced to about half the full angular range. Typically 40 iterations were required to minimise E to 1 part in $10^4$. Visual inspection of the images confirmed that correct unfoldings had been achieved when E had been minimised. For reference data acquired with a head loading phantom combined with target data from an orange, which presented a much lighter coil load, there was an offset in the minimum for translation in the frequency encode direction of 28 mm (see FIG. 15). Whilst this could reflect differences in coil performance with load, it seems most likely to be associated with a local minimum produced by the noise fluctuations in the data combined with the shallow nature of the minimum in this direction. It resulted in a mean unfolded signal intensity error of about 1% at the known position, although the visual difference between the known correct position and the minimum entropy position was undetectable. Registration of three-dimensional data to 3-D target data was also successful. Image entropy can be used as a parameter for determining correct alignment of reference and target data for SENSE imaging. The approach was successful in all cases tested and had a wide capture range.

There are several applications of this approach. For low field imaging, where coil loading effects are weak, it allows complete separation of the reference data acquisition from the patient examination and may allow the use of calculated sensitivity data or manufacturer supplied coil calibration data. In higher field applications modelling of coil loading effects can be added to the rigid body rotation and translations so that these are also determined by minimisation of entropy. This may require a perturbation type of approach, where the starting sensitivity data is correct for the approximate loading conditions. For flexible arrays or arrays which have mechanically separated coils the method could determined the optimal unfolding, with each coil sensitivity data adjusted by independent parameters.

While the above example has been described in relation to a two-dimensional set of data, the invention is applicable to a three-dimensional set of data i.e. to a series of slices rather than just to one slice or to true 3-D data.

Equally, while the above description has referred to omitting alternate phase-encode gradients to speed up data collection by a factor of two, the invention is also applicable to situations where more phase-encode gradient are omitted so that the field of view is reduced by a factor greater than 2, say 3, 4 or more.

While the above description has been in relation to a solenoidal type magnet, the invention is applicable to any means for producing the main field such as resistive superconductive or permanent magnets either solenoidal or open.

The description has also referred to calculation of entropy on the unfolded image it would also be possible to compare the data outputs from the coils in data space, rather than in image space.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. Apparatus for magnetic resonance imaging, comprising:
    means for exciting magnetic resonant (MR) active nuclei in a region of interest;
    an array of at least two r.f. receive coils for receiving r.f. signals from the region of interest;
    means for creating a number of magnetic field gradients in a phase-encode direction for spatially encoding the excited MR active nuclei, the number of phase-encode gradients corresponding to a reduced field of view compared to the region of interest;
    means for unfolding a representation of the data received by the coils of the array to restore the full field of view using representations of the sensitivity profiles of the individual coils of the arrays;
    and means for comparing a plurality of unfolded representations of the data for various modifications to the sensitivity profile representations used, and for selecting an unfolded representation according to a predetermined criterion.

2. Apparatus as claimed in claim 1, in which the modifications are translations of sensitivity profile representations relative to the received data representations.

3. Apparatus as claimed in claim 1, in which the modifications are rotations of the sensitivity profile representations relative to the received data representations.

4. Apparatus as claimed in claim 1, in which the modifications are models of different loading effects on sensitivity profile representations.

5. Apparatus as claimed in claim 1, in which the representations of data received and of the sensitivity profiles are spatial representations.

6. Apparatus as claimed in claim 1, in which the unfolded representation is selected according to a predetermined peak in the probability distribution of intensity of the unfolded images.

7. Apparatus as claimed in claim 1, in which the unfolded representation is selected according to the minimum entropy of the unfolded images.

8. A method of generating magnetic resonance images of a subject comprising the steps of:

generating a magnetic field in a main magnetic field direction in an examination region;

transmitting r.f. signals to excite MR active nuclei in a region of interest of the subject;

generating a number of magnetic field gradients in a phase-encode direction for spatially encoding the excited MR active nuclei, the number of phase-encode gradients corresponding to a reduced field of view compared to the region of interest;

generating a number of magnetic field gradients in a read-out direction;

receiving r.f. signals from the region of interest using an array of at least two r.f. receive coils;

unfolding a representation of the received r.f. signals to restore a full field of view using sensitivity profiles of the at least two r.f. receive coils; and comparing a plurality of unfolded representations corresponding to various modifications to the sensitivity profiles.

9. The method as set forth in claim 8 wherein the sensitivity profiles of the at least two r.f. receive coils is determined with the subject disposed at a first position with respect to the examination region and the received r.f. signals are received with the subject disposed at a second position with respect to the examination region.

10. An apparatus for magnetic resonance imaging, comprising:

an r.f. transmit coil for exciting magnetic resonant (MR) active nuclei in a region of interest;

an array of at least two r.f. receive coils for receiving r.f. signals from the region of interest;

a first gradient coil for creating a number of magnetic field gradients in a phase-encode direction for spatially encoding the excited MR active nuclei, the number of phase-encode gradients corresponding to a reduced field of view compared to the region of interest;

an unfolding processor for unfolding a representation of the data received by the coils of the array to restore the full field of view using representations of the sensitivity profiles of the individual coils of the array;

a comparing processor for comparing a plurality of unfolded representations of the data for various modifications to the sensitivity profile representations used; and a selection processor for selecting an unfolded representation according to a predetermined criterion.

* * * * *